United States Patent
Hedler

(10) Patent No.: US 6,555,415 B2
(45) Date of Patent: Apr. 29, 2003

(54) ELECTRONIC CONFIGURATION WITH FLEXIBLE BONDING PADS

(75) Inventor: Harry Hedler, Regensburg (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/022,606

(22) Filed: Dec. 17, 2001

(65) Prior Publication Data

US 2002/0094707 A1 Jul. 18, 2002

Related U.S. Application Data

(63) Continuation of application No. PCT/DE00/01983, filed on Jun. 16, 2000.

(30) Foreign Application Priority Data

Jun. 17, 1999 (DE) .......................................... 199 27 749

(51) Int. Cl.[7] .......................... H01L 21/48; B23K 31/02
(52) U.S. Cl. ........................ 438/108; 438/613; 438/666; 228/180.22
(58) Field of Search ............................... 257/734, 737, 257/738, 777, 778, 779, 780, 781, 786; 438/106, 108, 613, 614, 612, 666; 228/180.21, 180.22

(56) References Cited

U.S. PATENT DOCUMENTS

| 5,299,939 A | 4/1994 | Walker et al. ................ 439/74 |
|---|---|---|
| 5,312,456 A | * 5/1994 | Reed et al. .................. 411/456 |
| 5,457,879 A | 10/1995 | Gutler et al. .................. 29/895 |
| 5,477,087 A | 12/1995 | Kawakita et al. ............ 257/737 |
| 5,508,228 A | 4/1996 | Nolan et al. ................. 438/614 |
| 5,685,885 A | 11/1997 | Khandros et al. ............. 29/841 |
| 5,812,378 A | 9/1998 | Fjelstad et al. ............. 361/769 |
| 5,903,059 A | * 5/1999 | Bertin et al. ................ 257/785 |
| 6,007,349 A | 12/1999 | Distefano et al. ............. 439/71 |

FOREIGN PATENT DOCUMENTS

| DE | 196 39 934 A1 | 4/1998 |
|---|---|---|
| DE | 198 41 996 A1 | 3/2000 |
| EP | 0 295 914 A2 | 12/1988 |
| EP | Wo 00/79590 | * 12/2000 |
| JP | 00 102 817 92 A | 11/1989 |
| JP | 2-180 036 | 7/1990 |
| JP | 5-144 823 | 6/1993 |
| WO | WO 98/50950 | 11/1998 |
| WO | WO 98/55669 | 12/1998 |
| WO | WO 99/05895 | 2/1999 |

* cited by examiner

Primary Examiner—Albert W. Paladini
Assistant Examiner—Alonzo Chambliss
(74) Attorney, Agent, or Firm—Laurence A. Greenberg; Werner H. Stemer; Gregory L. Mayback

(57) ABSTRACT

An electronic configuration has a first surface with electrical contacts for electrical bonding. The configuration includes at least one flexible elevation made of an insulating material that is arranged on the first surface. The flexible elevation has at least one recess and the surface of the flexible recess is at least partially covered with an electrically conductive material to form one of the electrical contacts.

14 Claims, 11 Drawing Sheets

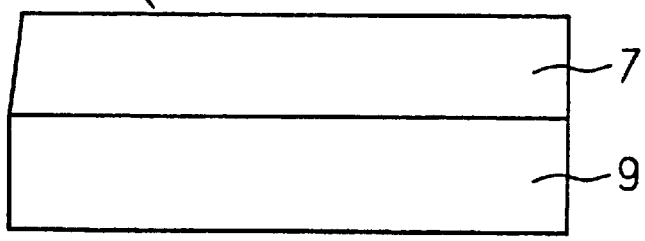
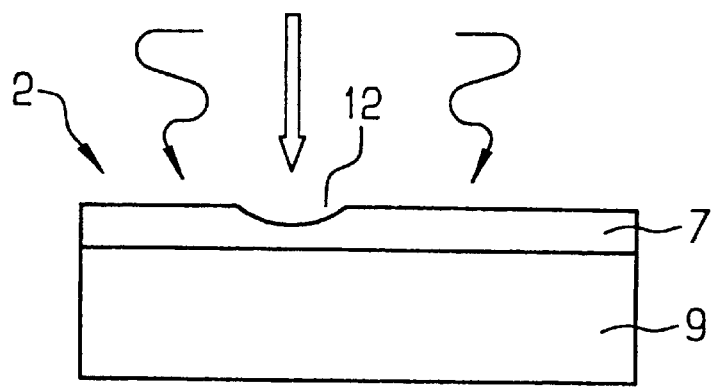
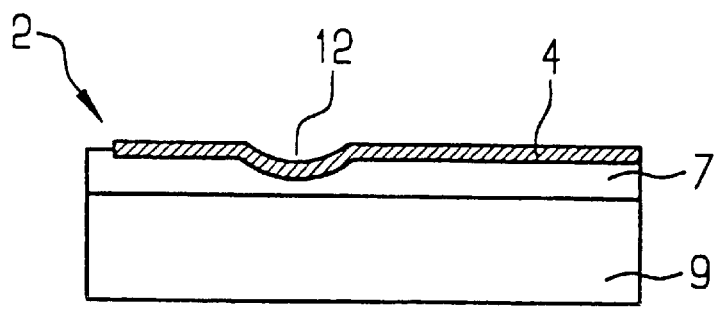

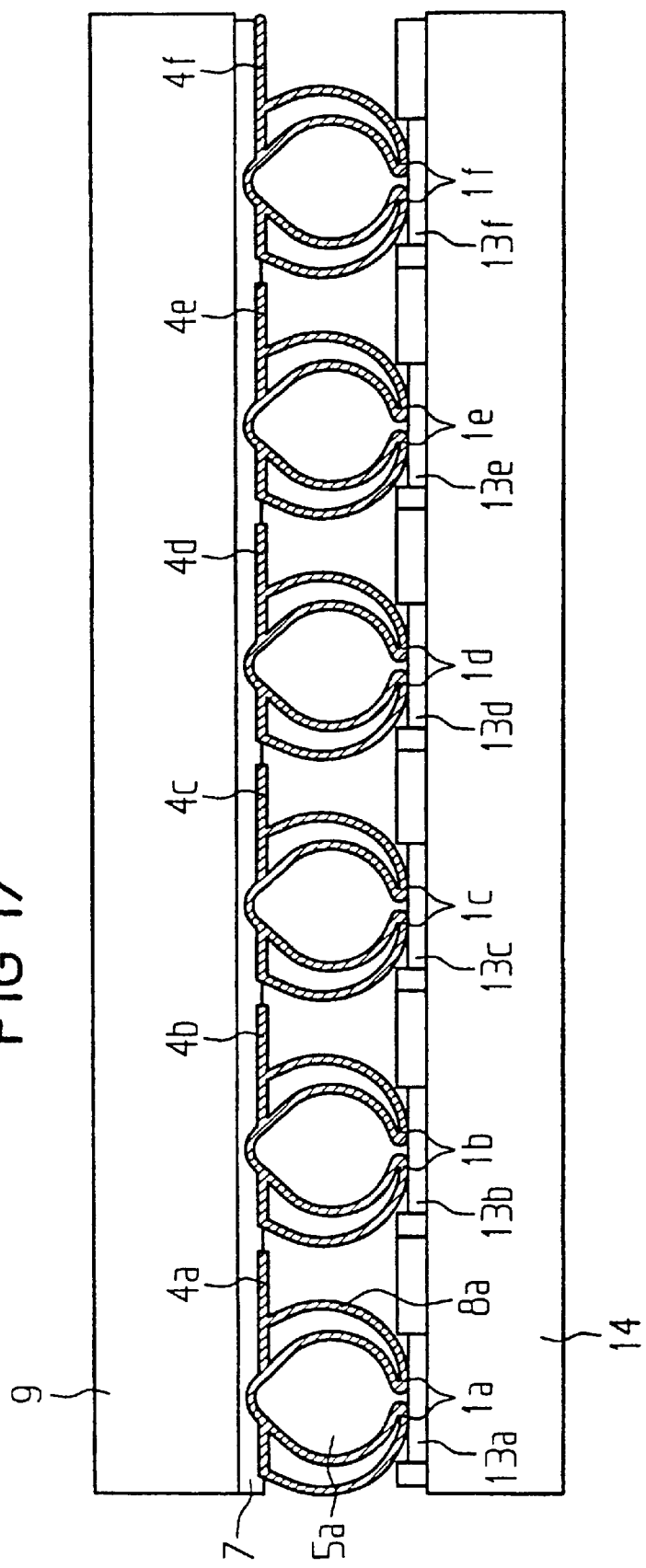

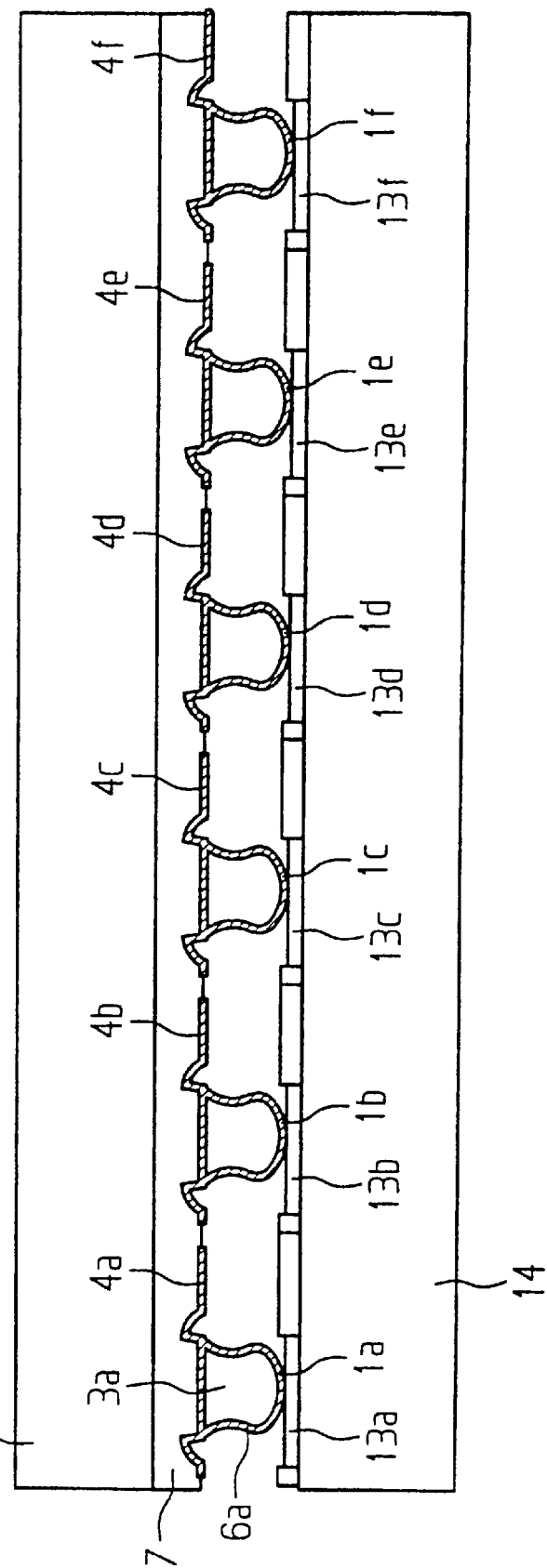

ELECTRONIC CONFIGURATION WITH FLEXIBLE BONDING PADS

CROSS-REFERENCE TO RELATED APPLICATION

This application is a continuation of copending International Application No. PCT/DE00/01983, filed Jun. 16, 2000, which designated the United States.

BACKGROUND OF THE INVENTION

Field of the Invention

The present invention relates to an electronic configuration with electrical contacts, at least on a first surface of the electronic configuration, which enable the electronic configuration to be electrically bonded. The electronic configuration may in this case take the form of an electronic component or a component carrier, for example.

Electrical bonding of these configurations, for example, by means of solder balls, contact pins, or directly soldered connections between the electronic configuration and a further configuration (for example between a component and a carrier on which the component is to be mounted) is problematic to the extent that thermal loading may cause different linear expansions of the electronic configurations. This results in mechanical stresses at the soldered connections between the electronic configurations (that is to say, for example, between the component carrier and the electronic component). Such stresses may also occur, however, as a result of other mechanical loads on the configurations. One consequence of these stresses is the risk of damage or destruction to the soldered connections between the electronic configurations.

It is known from the prior art, as disclosed by U.S. Pat. No. 5,685,885, to arrange electrical contacts on a flexible layer. However, this layer has proven to be insufficiently elastic to optimally absorb the mechanical stresses that occur. In addition, the production of components with the layer disclosed there is relatively complicated.

SUMMARY OF THE INVENTION

It is accordingly an object of the invention to provide an electronic configuration and a method for producing the electronic configuration which overcome the above-mentioned disadvantages of the prior art apparatus and methods of this general type.

In particular, it is an object of the invention to provide an electronic configuration and a method for producing the electronic configuration in which greater insensitivity to mechanical stresses is obtained in the region of the electrical contacts.

With the foregoing and other objects in view there is provided, in accordance with the invention, a method for producing an electronic configuration having a first surface with at least one electrical contact for bonding. The method includes steps of: providing an electronic configuration having a first surface; configuring at least one flexible elevation made of an insulating material on the first surface; providing the flexible elevation with at least one recess; at least partially covering a surface of the flexible elevation with an electrically conductive material to form an electrical contact; applying an insulating layer at least partially to the first surface; forming a structural feature in a region of the insulating layer; forming the structural feature as a feature selected from the group consisting of a depression formed in the region of the insulating layer and a roughened surface formed in the region of the insulating layer; providing the insulating layer with a metallization at least in the region of the structural feature; and forming a recess selected from the group consisting of a first recess running perpendicularly in relation to the first surface and a second recess running parallel in relation to the first surface. When selecting the first recess as the recess, the flexible elevation is configured over the structural feature. When selecting the second recess as the recess, the flexible elevation is configured directly alongside the structural feature. The method also includes steps of: performing the step of forming the recess by directing laser light towards the structural feature such that the structural feature performs an operation selected from the group consisting of focusing the laser light and scattering the laser light; and applying an electrically conductive material at least partially to the surface of the flexible elevation.

At least one flexible elevation made of an insulating material is provided on the first surface of the electronic configuration on which the electrical contacts of the configuration are arranged. At least one electrical contact is arranged on the flexible elevation and is in the form of an electrically conductive material that at least partially covers the surface of the flexible elevation. This consequently elastically attaches the electrical contacts on the electronic component, so that, under thermal or mechanical loading of the component, the corresponding stresses are absorbed by the flexible elevation. This is performed much better in the case of an elevation, as opposed to the prior art straight-extending layer, since the elevation has a greater freedom of movement and can therefore compensate for greater tolerances. The flexible elevation has a recess enabling the flexibility of the elevation to be further enhanced.

In principle, the entire flexible elevation may also be produced from a flexible and electrically conductive material, so that the conducting connection is not established by a separate conduction path of a different material, but by the flexible material itself. However, very specific materials are necessary to achieve this, restricting the selection of flexible materials and their composition. What is more, such materials are generally more resistive than a purely conductive material, which forms a conductive path. In the preferred solution, in which the electrically conductive material covers the surface of the flexible elevation, a separate optimization of the flexible characteristics and of the conduction characteristics of the elevation is consequently possible.

This configuration has special significance in the case of electronic components which have a size that may, for example, correspond largely to the size of the electronic circuit, or of the circuit chip of the component, such as chip-size components, for example. Particularly in this specific case, apart from the electronic circuit or the circuit chip, there are virtually no other housing elements that could absorb the stresses on the electronic component. In the case of such components, there is a particularly high risk that the electrical contacts will be damaged or destroyed. Particularly in such a case, the occurrence of excessive mechanical stresses can be avoided, and consequently the operational reliability of the component ensured, by a flexible elevation such as that proposed according to the invention. However, the inventive teaching may also be advantageously used in the case of any other electronic configurations.

The electrical contacts of the electronic component are consequently arranged on a flexible elevation that compensates for the mechanical stresses that occur. To establish a conducting connection to an electrical contact on an elevation, a conductive path can be arranged on the outer surface of the flexible elevation, that is to say outside the recess. As an alternative to the conductive path on the outer surface of the flexible elevation, a conductive path may also be arranged in the recess of the flexible elevation. The conducting connection is consequently routed over the inner surface of the flexible elevation, that is to say, over the surface formed by the recess.

An electronic circuit, which is connected in a conducting manner to the electronic contacts, may then be provided in the electronic configuration. The electronic circuit may, for example, directly adjoin the flexible elevation, but additional conductor runs may also be arranged between the flexible elevation and the electronic circuit, so that the flexible elevation can be arranged at a distance from the electronic circuit.

If further conductor runs are provided, for example, between an electronic circuit and the flexible elevation, they may be arranged on an insulating layer that at least partially covers the first surface of the electronic component, with the insulating layer adjoining the flexible elevation. This has the advantage that the conductor runs can be structured by indirect structuring, to be specific, by structuring the insulating layer.

The recess that is provided in the flexible elevation may be formed in various ways. It may be provided that the recess extends parallel in relation to the first surface into the flexible elevation. In particular, the recess may, in this case, be formed by a notching or an indentation formed in the surface of the flexible elevation in which the indentation runs parallel in relation to the first surface. However, the recess may also have, for example, the form of a channel or of a tube running through the flexible elevation.

It may alternatively be provided that the recess extends into the flexible elevation perpendicularly in relation to the first surface. The recess may in this case be formed, for example, by a trough-shaped or trench-shaped indentation or notch formed in the surface of the flexible elevation and configured perpendicularly in relation to the first surface. The recess may also be, for example, as a dish-shaped hollowing of the flexible elevation formed perpendicularly in relation to the first surface.

A corresponding shaping of the recess in the flexible elevation can still further improve the flexibility of the flexible elevation. This is achieved by the reduction in the cross-sectional area of the flexible elevation, which is brought about by the recess.

On the other hand, however, the shaping of the flexible elevations may be made to match one another in such a way that two flexible elevations respectively interact with each other, and can in this way form an electrical contact. For example, an elevation whose recess extends parallel in relation to the first surface may in each case interact with an elevation whose recess extends perpendicularly in relation to the first surface, in accordance with a press-stud principle, with the first elevation engaging in the recess of the second elevation. In this way, for example, electrical contacts can be formed within electronic modules, so that a conducting connection can be established from a first electronic configuration to a second electronic configuration. The first configuration may in this case be in the form of an electronic component, and the second configuration can be in the form of a component carrier or else a further electronic component, for example.

A method for producing an electronic configuration such as that described above is presented below. In a first step, an insulating layer is applied to the first surface, so that the insulating layer at least partially covers the first surface. Subsequently, a depression is structured into the insulating layer, or the surface of the insulating layer is roughened at least in the region on or alongside which the flexible elevation is to be placed. Then, the insulating layer is provided with a metallization, at least in the region of the at least one depression. Finally, the flexible elevation is arranged over the at least one depression or directly alongside the at least one depression and the recess is formed using a laser.

This method proves to be particularly advantageous, because if only laser structuring were performed, it might be too inaccurate for creating the recesses desired, or could only be performed with relatively complicated means. Rather, the fact is exploited that the depression previously formed depression in the insulating layer and its subsequent metallization create a focusing mirror on the first surface. An appropriate configuration of the depression and of the flexible elevation, additionally focuses the laser radiation acting on the flexible elevation, so that the formation of the recess in the desired form is achieved or is possibly assisted.

If, for example, the flexible elevation is arranged directly over the depression, laser irradiation directed perpendicular to the first surface does not produce a funnel-shaped hollowing, but rather produces a trough-shaped or dish-shaped hollowing of the flexible elevation. If, on the other hand, the flexible elevation is arranged directly alongside one or more depressions, with laser irradiation directed perpendicular in relation to the first surface, the laser radiation is focused on the side walls of the flexible elevation so that an indentation or notching is formed parallel in relation to the first surface.

An analogous situation applies if, instead of a depression, a rough surface is created on the insulating layer and then is metallized. This produces a scattering reflection mirror, which scatters back the impinging light in a wide variety of different spatial directions, and consequently likewise structures the recess in directions that deviate from the (ideally perpendicular) direction of incidence of the laser radiation. The application of the metallization does not represent an additional method step, since the metallization can also be used at the same time for forming conduction paths or conductor runs on the electronic configuration.

The insulating layer is preferably applied to the first surface using a pressure process, which can be carried out easily and at low cost and nevertheless with the required accuracy. Similarly, the flexible elevation can also be applied by such a pressure process. Like the formation of the recess, the formation of the depression or depressions in the insulating layer may likewise be performed using a laser.

The conductive material for producing the conductor runs or the conduction paths and the electrical contacts may be applied to the flexible elevation or to the insulating layer by customary methods, such as, for example, sputter metallization or chemical metallization. Specific methods to achieve this are described in International Publication WO 98/55 669 and in International Publication WO 99/05 895, with initial nucleation in an insulating layer and subsequent metallization of these regions. As an alternative to these prior-art methods, the surface may be roughened by laser treating the surface of the flexible elevation, and possibly also by laser treating the flexible layer, or by some other suitable method that offers better adhesion for the conductive material of the metallization to be applied later. It may also be provided in this case that, before applying the metallization and after roughening the surface, metal nuclei or other suitable nuclei, which may consist of any suitable material, for example palladium, are applied to the rough surface.

Other features which are considered as characteristic for the invention are set forth in the appended claims.

Although the invention is illustrated and described herein as embodied in an electronic configuration with flexible bonding pads, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 1 shows a semiconductor chip after an insulating layer has been pressed on;

FIG. 2 shows a depression being structured into the insulating layer using a laser;

FIG. 3 shows the insulating layer with an applied metallization;

FIG. 17 schematically shows a general view of the electrical connection of an electronic component to an electronic configuration in accordance with FIG. 8;

FIG. 18 is the same as FIG. 17, but with an electrical connection in accordance with FIG. 16;

FIG. 19 is the same as FIG. 17, but with an electrical connection in accordance with FIG. 14.

DESCRIPTION OF THE PREFERRED EMBODIMENTS

Figure 4:
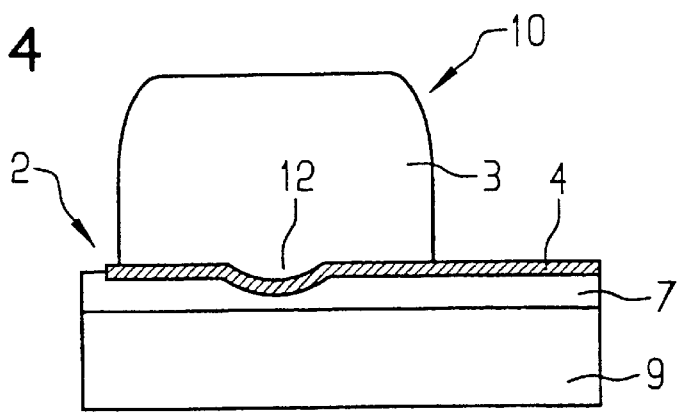
FIG. 4 shows a flexible elevation applied to the metallization.
Figure 5:
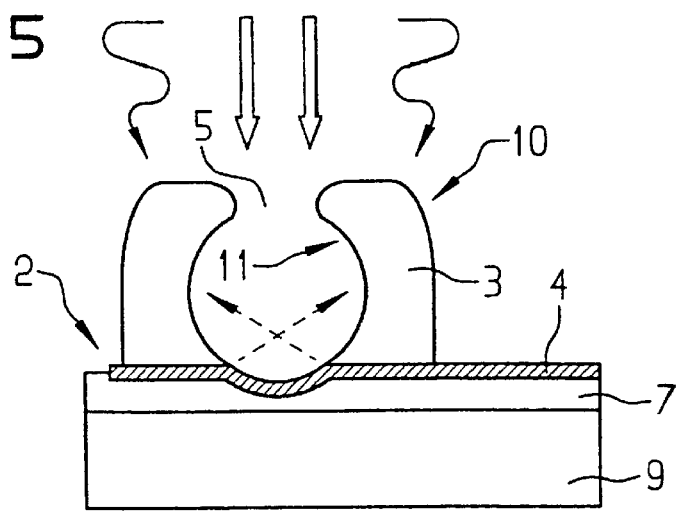
FIG. 5 shows a dish-shaped recess being structured into the flexible elevation.
Figure 6:
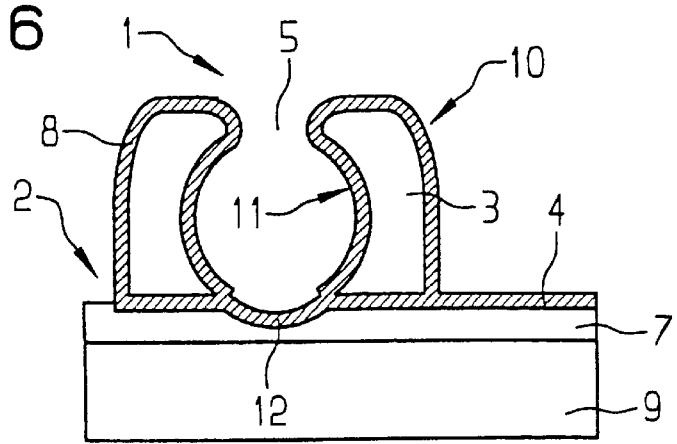
FIG. 6 shows the surface of the flexible elevation with metallization.

FIGS. 1 to 6 illustrate the production of a flexible elevation that can be used for electrically bonding an electronic component, such as a chip-size semiconductor component for example. In this case, first an insulating layer 7 is applied to a first surface 2 of a semiconductor chip 9. This layer can be applied, and possibly can be structured in a first manner, in a simple way by, for example, a pressure process. The structuring of a depression 12 into the insulating layer 7 is subsequently performed. It is possible in principle for this structuring to take place in any desired way, for example as part of the aforementioned pressure process, or else using a laser, as represented in FIG. 2.

A laser may be used to roughen the surface of the insulating layer 7, at least in those regions in which the metallization 4 is to be formed in a later step. The rough surface in this case enables better adhesion of the conductive material of the metallization 4 on the surface. An analogous step may also be performed for the surface of the flexible elevation 3 in a later stage of the method, to produce better adhesion of the electrically conductive material 8.

However, the roughening of the surface of the insulating layer 7 may also be additionally performed in the region on or alongside which the flexible elevation 3 is later applied. If, as described above, a depression 12 has been produced at this location, a roughening of the surface of the depression 12 is performed. However, such surface roughening may even make it possible to dispense with a depression 12. Then, a rough surface is obtained on the insulating layer 7, on which a likewise rough metallization 4 is produced. While the depression 12 acts like a focusing mirror after the metallization 4 is applied, the rough surface with metallization 4 acts like a scattering reflection mirror, which reflects perpendicularly impinging light back in different directions, which generally do not coincide with the direction of incidence.

After the depression 12 has been structured, and possibly after the surface of the insulating layer has been roughened, the metallization 4 is applied to the insulating layer 7, so that the insulating layer 7 is at least partially covered by the metallization 4. At least the region of the depression 12 is thereby covered by the metallization 4. The structuring of the depression 12 or the roughening and application of the metallization 4 is performed in such a way that a mirror with the desired focusing effect is formed for the later method steps. Only one depression 12 is discussed below.

A flexible elevation 3 is then applied in the region of the depression 12, so that the depression 12 is covered by the flexible elevation 3. This application of the flexible elevation may be performed in any desired way, such as a pressure process, for example. A recess 5 is subsequently structured into the flexible elevation 3 using a laser to act on the surface 10 of the flexible elevation 3 perpendicularly in relation to the surface 2 of the semiconductor chip 9. Coming from the surface 10 of the flexible elevation 3, the laser radiation thereby initially penetrates into the flexible elevation 3, to structure the first part of the recess 5 in the flexible elevation 3. Subsequently, the mirror, which has been formed in the depression 12, has an additional reflective effect and focusing effect on the laser radiation, and this effect gives the recess 5 a trough-shaped or dish-shaped structure with an inner surface 11. Such a structure is more favorable with regard to flexibility and stability of the flexible elevation than an entirely funnel-shaped recess. If, in addition to the depression 12 or instead of the depression 12, a rough, metallized surface is provided, the trough-shaped or dish-shaped structure is also obtained or exclusively obtained by the scattering reflective effect of the rough surface.

Finally, a metallization of the surface 10, 11 of the flexible elevation 3 is performed. It is also possible in principle for a partial metallization of the surface to be performed, for example, only the outer surface 10 or else only the inner surface 11 of the flexible elevation. This depends on the desired type of electrical bonding, as will be further elaborated upon later. It merely has to be ensured that an electrically conducting connection of the now-formed electrical contact 1 can be established with respect to possibly existing conduction paths or conductor runs 4.

Figure 7:
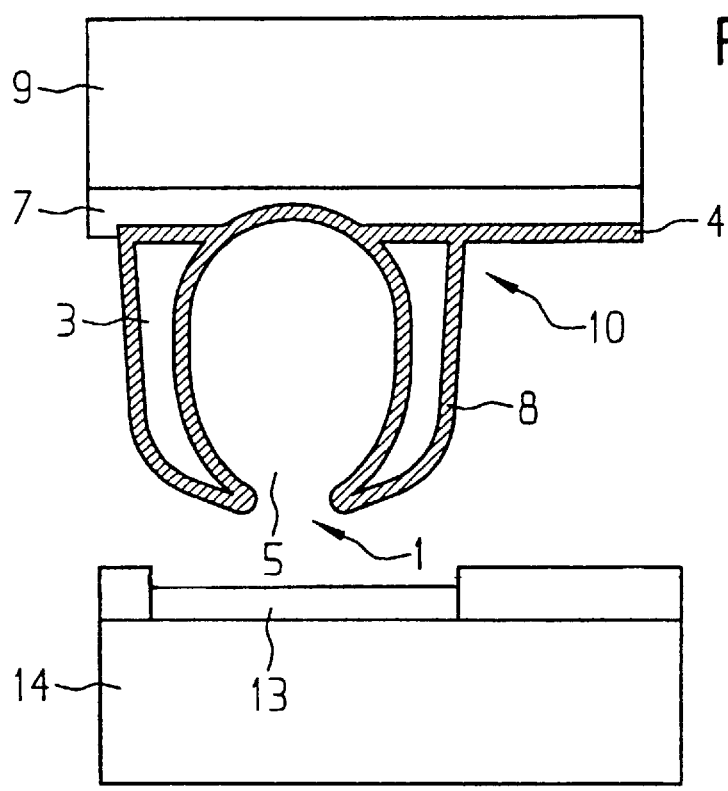
FIG. 7 shows the flexible elevation before being pressed onto a contact area.

As represented in FIG. 7, for electrically bonding the semiconductor chip 9, the flexible elevation, which forms the electrical contact 1, can be pressed onto a contact area of another electronic configuration 14, for example, of a chip carrier. In the present example, it is necessary, for this purpose that at least the outer surface 10 of the flexible elevation 3 has a metallization 8. After the flexible elevation 3 has been pressed onto the contact area 13, the flexible elevation is deformed by the applied pressure, as represented in FIG. 8, whereby a flexible bonding, i.e. a flexible, electrically conducting connection, is produced between the semiconductor chip 9 and the further electronic configuration 14.

Figure 8:
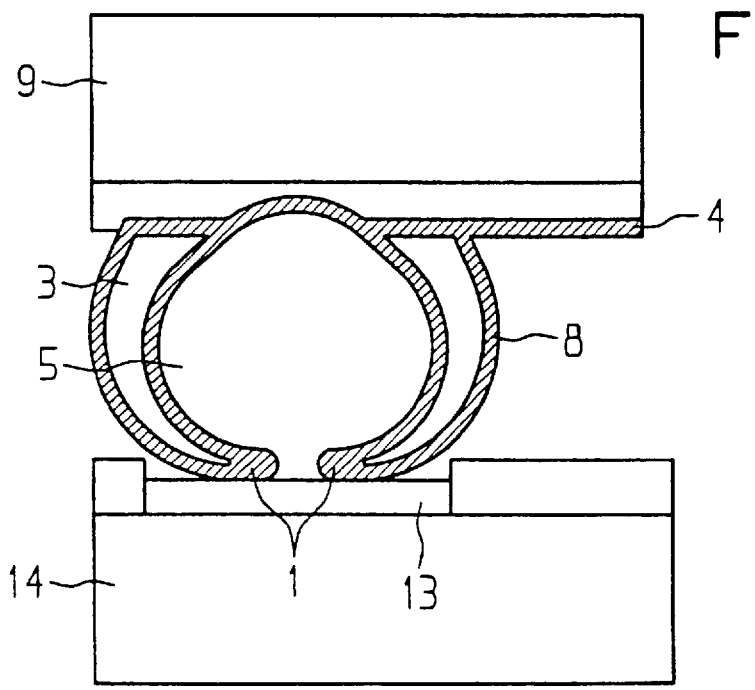
FIG. 8 shows the flexible elevation after being pressed onto the contact area.
Figure 9:
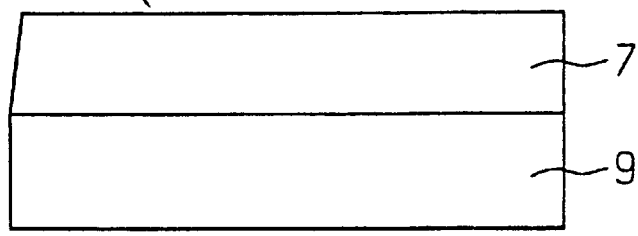
FIG. 9 shows a semiconductor chip after being pressed onto an insulating layer.

A schematic general view of a semiconductor chip 9 with electrical connections according to the principle illustrated with FIG. 8 is shown in FIG. 17. The semiconductor chip, in this case, has a plurality of flexible elevations, which form the electrical contacts 1a to 1f. These electrical contacts 1a to if establish an electrically conductive connection with contact areas 13a to 13f of a further electronic configuration 14. Conductor runs 4a to 4f lead from each of the electrical contacts 1a to if, and may be connected, for example, to an electronic circuit.

An alternate method for producing a flexible elevation is represented in FIGS. 9 to 12. In this case, the application of an insulating layer 7 to a semiconductor chip 9 is likewise performed first. This method step consequently corresponds to the method step according to FIG. 1.

Figure 10:
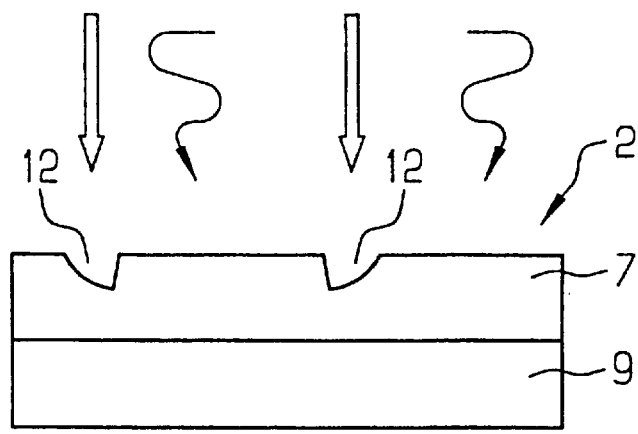
FIG. 10 shows two depressions being structured into the insulating layer using a laser.
Figure 11:
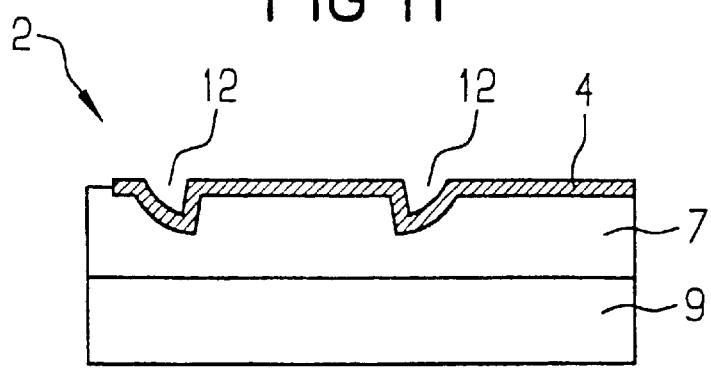
FIG. 11 shows the insulating layer with an applied metallization.
Figure 12:
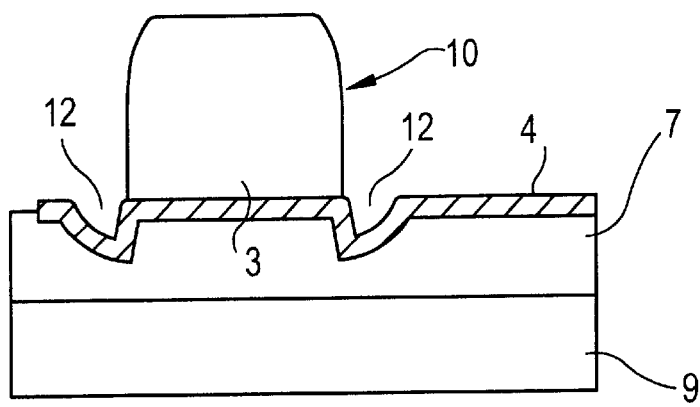
FIG. 12 shows a flexible elevation applied between the depressions.

One or more depressions 12 are subsequently structured into the insulating layer 2, two depressions being represented in the present example shown in FIG. 10. However, it is also possible, for example, for a single, annular depression to be formed. Alternatively, in addition to or instead of forming the depressions 12, a rough surface may also be produced. The rough surface acts as a scattering reflection mirror, in a way analogous to that described with regard to FIGS. 1–6. However, only depressions 12 are discussed below, by way of example. The structuring of this depression 12 or of these depressions 12 may likewise be performed using a laser. After that, the insulating layer 7 is at least partially metallized 4, at least in the region of the depressions 12.

Figure 13:
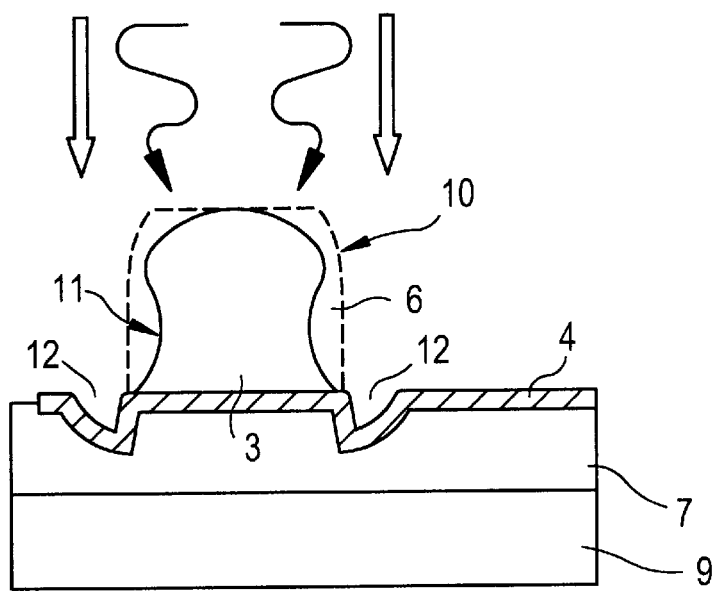
FIG. 13 shows indentations being structured into the side walls of the flexible elevation using a laser.
Figure 14:
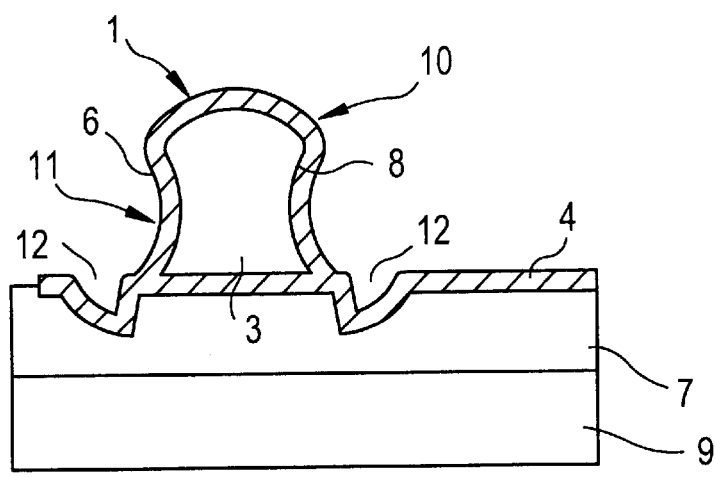
FIG. 14 shows the surface of the flexible elevation with metallization.

The flexible elevation 3 is then arranged alongside or between the depressions 12. This is followed by a step of structuring recesses into the flexible elevation. A laser again acts on the flexible elevation 3 perpendicularly in relation to the first surface 2 of the semiconductor chip 9. The reflective effect and focusing effect of the depressions 12, which can act as a mirror, direct the laser radiation in the example shown in FIG. 13 onto the side walls of the flexible elevation 3 and thereby form indentations 6 in the side walls of the flexible elevation 3. These indentations 6 are arranged perpendicularly in relation to the first surface 2 of the semiconductor chip 9 and have an inner surface 11. Finally, a metallization of the surface 10, 11 of the flexible elevation 3 is again performed, so that this surface 10, 11 is covered with an electrically conductive material 8, whereby the flexible elevation 3 forms an electrical contact 1 (FIG. 14). As represented in FIG. 19, such an electrical contact can, analogously with the case shown in FIG. 17, likewise be pressed onto contact areas 13 of a further electronic configuration. FIG. 19 shows a schematic representation of a semiconductor chip with a plurality of electrical contacts 1a to if, which are pressed onto contact areas 13a to 13f of a further electronic configuration 14. Again conductor runs 4a to 4f are provided, which are each in an electrically conducting connection with a respective electrical contact 1a to 1f.

Figure 15:
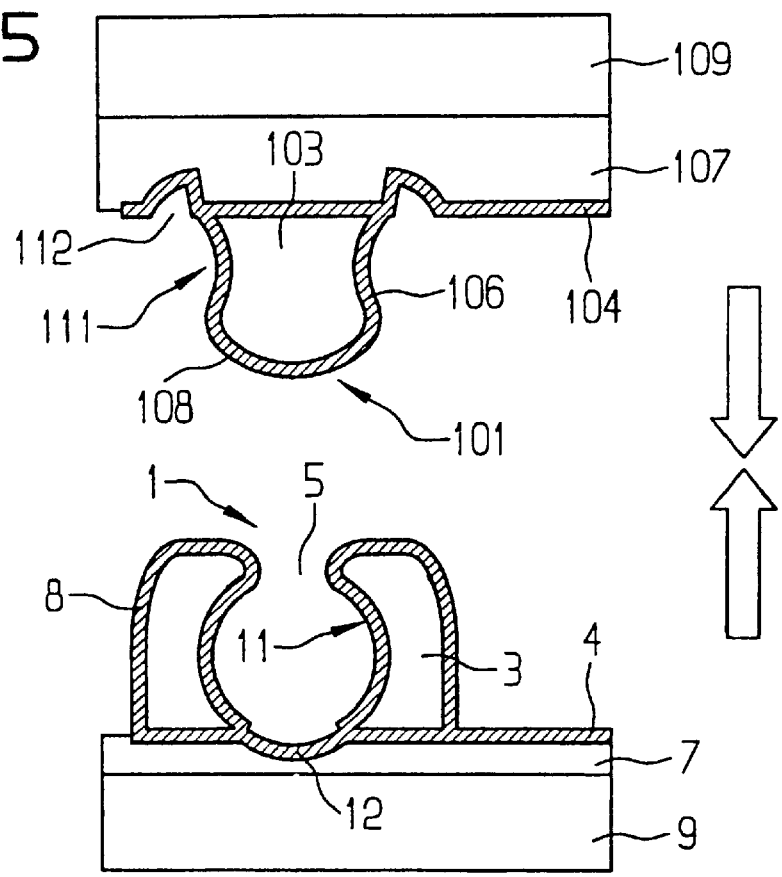
FIG. 15 shows a flexible elevation with indentations and a flexible elevation with a dish-shaped hollowing being brought together.
Figure 16:
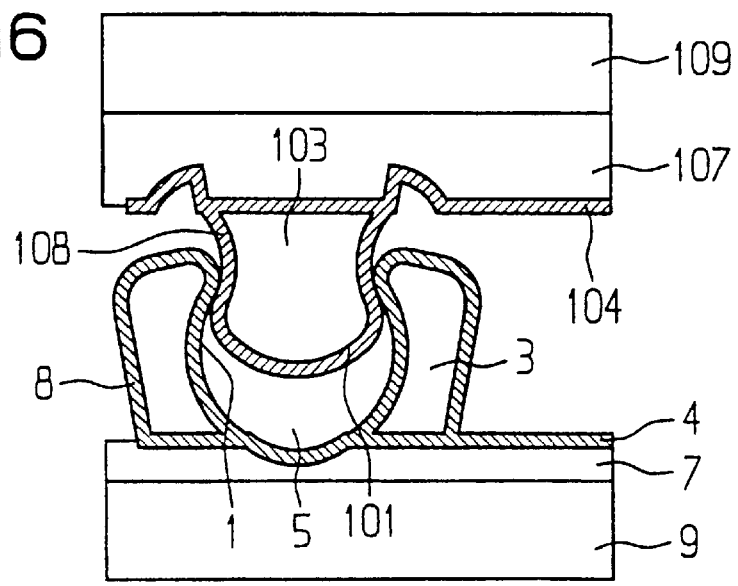
FIG. 16 shows the engagement of the flexible elevation with indentations into the flexible elevation with a dish-shaped hollowing.
Figure 1B:
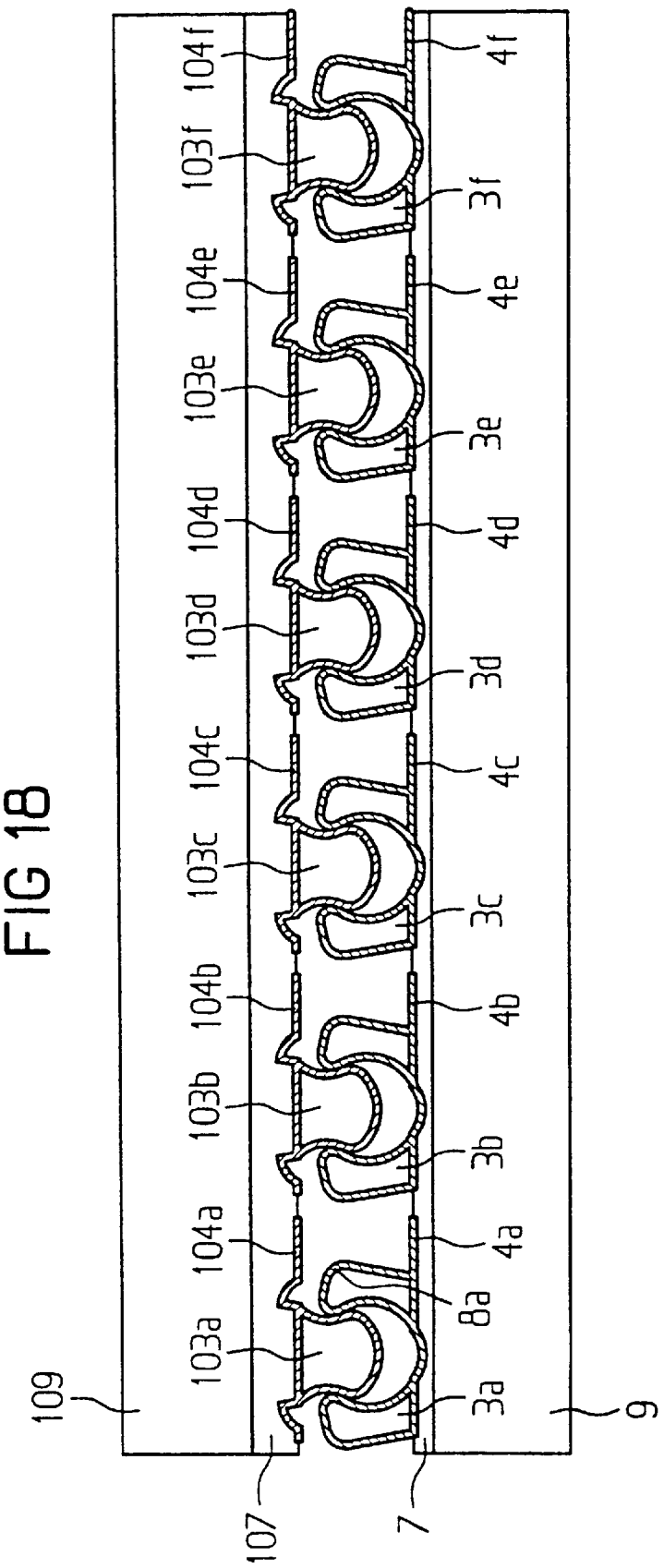

In the case of a correspondingly adapted configuration of the flexible elevations, however, an interaction of two flexible elevations 3, 103 can also be achieved. As FIG. 15 shows, one of the flexible elevations 3 has a trough-shaped or dish-shaped recess 5, while the other flexible elevation 103 has indentations 106. The first flexible elevation 3 consequently forms an electrical contact 1 of a first electronic configuration 9, for example, of a semiconductor chip. The second flexible elevation 103 forms an electrical contact 101 of a further electronic configuration 109, for example, of a chip carrier or of a further semiconductor chip. For this purpose, the first flexible elevation 3 has a metallization 8 at least on its inner surface 11, while the second flexible elevation 103 has a metallization 8 at least on the inner surface 111, which is formed by the indentations 106. As FIG. 16 shows, given an adapted shaping of the two elevations 3, 103, when they are brought together, the second flexible elevation 103 engages into the trough-shaped or dish-shaped recess 5 of the first flexible elevation 3. The indentations 106 of the second flexible elevation 3 in this case provide a snap fit in the first flexible elevation 3 and prevent the second flexible elevation 103 from sliding out of the recess 5 of the first flexible elevation 3. This achieves the formation of a stable and nevertheless flexible electrical connection in a simple way between the semiconductor chip 9 and a further electronic configuration 109, such as a chip carrier, for example. Such an electrical connection is suitable in particular for forming electronic modules, since it ensures adequate stability and flexibility of the modules, and at the same time allows individual elements of the module to be easily exchanged. An overall representation of such a module is schematically represented in FIG. 18 which shows a semiconductor chip 9 having a plurality of flexible elevations 3a to 3f engaging in the flexible elevations 103a to 103f of a further electronic configuration 109, such as for example, a chip carrier, to establish electrically conducting connections. In this case, each of the flexible elevations 3a to 3f and 103a to 103f is connected to conductor runs 4a to 4f and 104a to 104f, respectively. These conductor runs may again establish the electrical connection to an electronic circuit.

Figure 20:
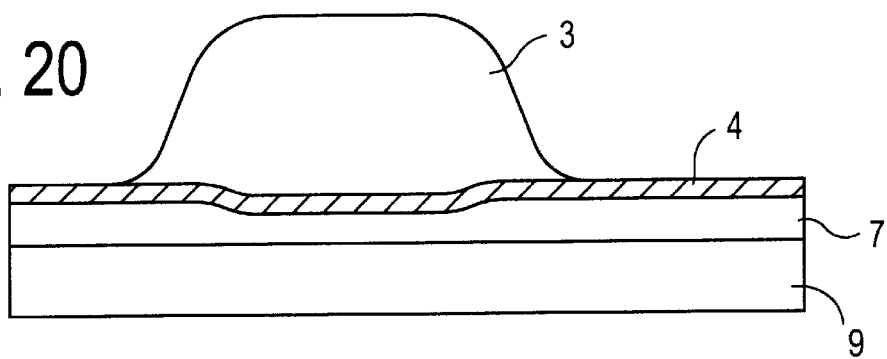
FIGS. 20 to 24 show further alternative embodiments of flexible elevations.
Figure 21:
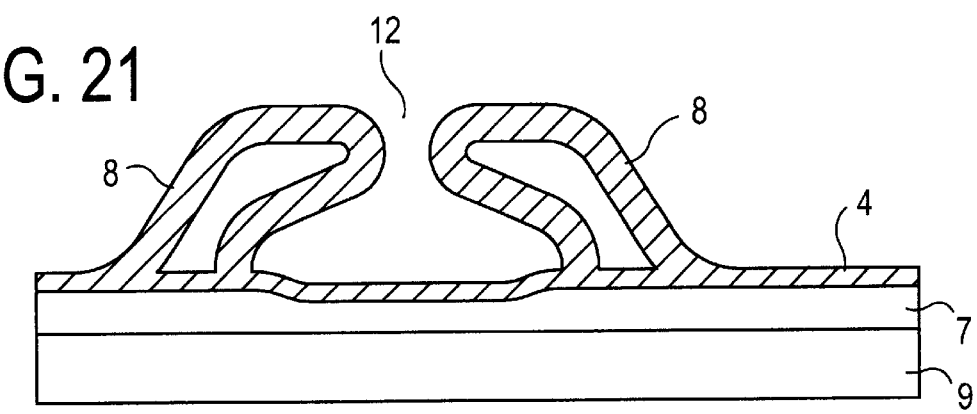
Figure 22:
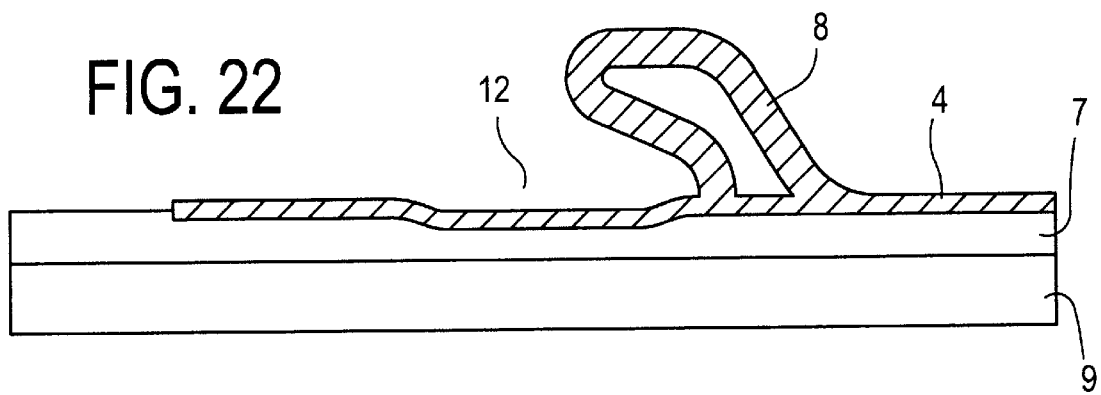
Figure 23:
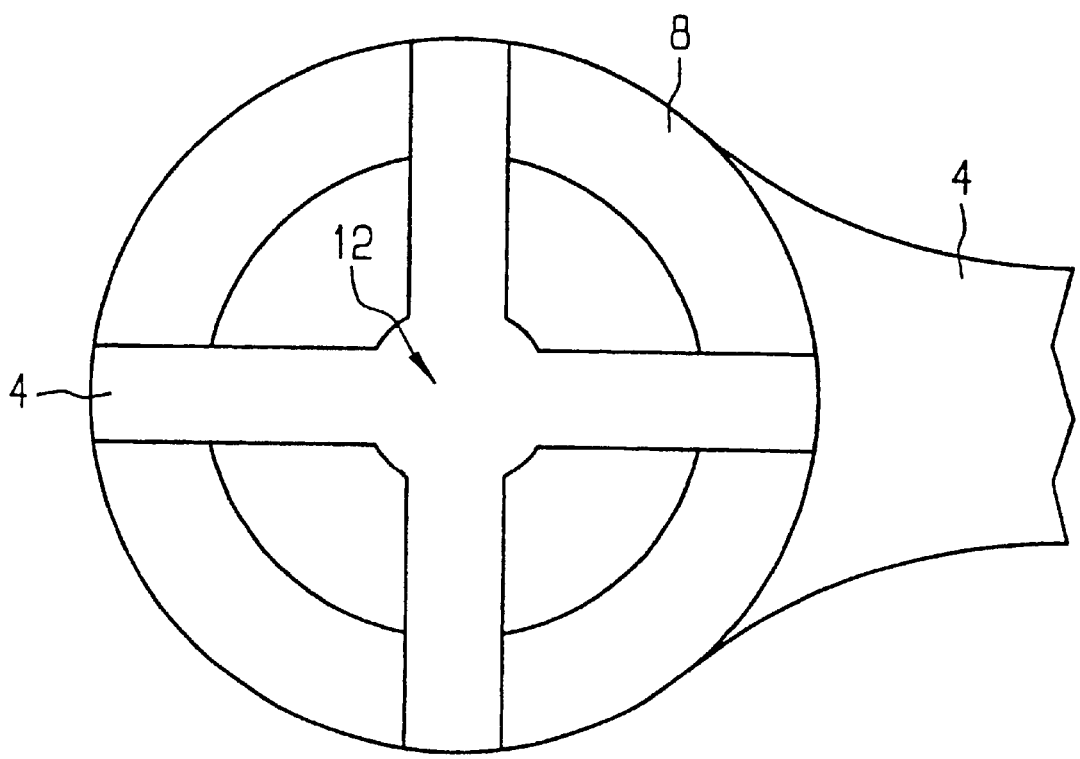

FIGS. 20 to 23 show further examples of possible configurations of the flexible elevation 3. Again based on a pressed-on flexible elevation 3, as FIG. 20 shows, the recesses of the flexible elevation 3 may be structured differently. Mutually opposing elements may remain, as represented in FIG. 21, in which the individual elements have a sectorized form, for example, as the plan view of such an elevation 3 in FIG. 23 shows. The resilience of the flexible elevation can be further varied by the number and size of the sectors and the depth of the recesses. It is even possible to set the end of the resilient excursion; that is to say, the point at which the individual sectors touch the flexible elevation as the result of a deformation under a perpendicular pressure. However, it is also possible for only a single element to remain, as represented in FIG. 22, corresponding for example, to a single sector or two sectors from FIG. 23.

Figure 24:
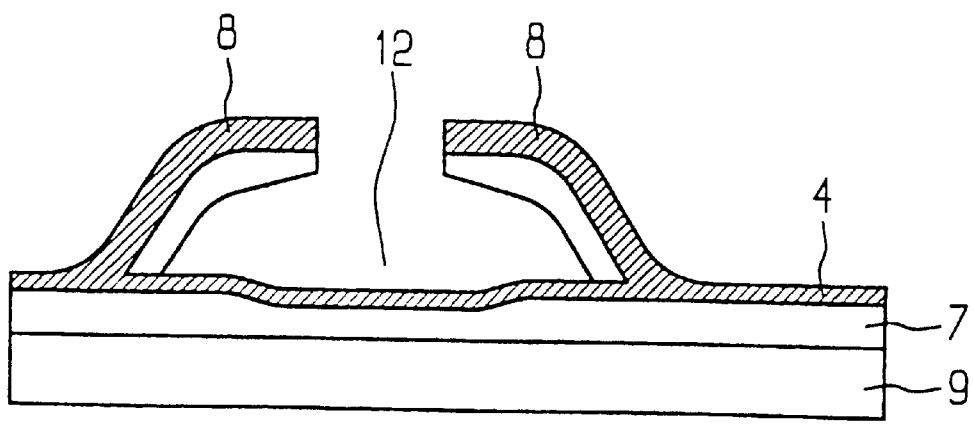

In general, the resilience can also be set for all of the flexible elevations by means of the type and thickness of the layer of the electrically conductive material 8 on the surface of the flexible elevation 3. In all of the FIGS. 1 to 23, configurations in which virtually the entire surface of the elevation 3 is covered with an electrically conductive material 8 have been represented. However, it may also be provided in the case of each of these configurations that only part of the surface is covered with conductive material 8, as represented, for example, in FIG. 24, taking the outer surface as an example. This can take place, for example, by a selectively roughening the outer surface, and a subsequent metallization, possibly after seeding the surface, for example with palladium.

We claim:

1. A method for producing an electronic configuration having a first surface with at least one electrical contact for bonding, which comprises:
    providing an electronic configuration having a first surface;
    configuring at least one flexible elevation made of an insulating material on the first surface;
    providing the flexible elevation with at least one recess;
    at least partially covering a surface of the flexible elevation with an electrically conductive material to form an electrical contact;
    applying an insulating layer at least partially to the first surface;
    forming a structural feature in a region of the insulating layer;
    forming the structural feature as a feature selected from the group consisting of a depression formed in the region of the insulating layer and a roughened surface formed in the region of the insulating layer;
    providing the insulating layer with a metallization at least in the region of the structural feature;
    forming a recess selected from the group consisting of a first recess running perpendicularly in relation to the first surface and a second recess running parallel in relation to the first surface;
    when selecting the first recess as the recess, configuring the flexible elevation over the structural feature;
    when selecting the second recess as the recess, configuring the flexible elevation directly alongside the structural feature;
    performing the step of forming the recess by directing laser light towards the structural feature such that the structural feature performs an operation selected from the group consisting of focusing the laser light and scattering the laser light; and
    applying an electrically conductive material at least partially to the surface of the flexible elevation.

2. The method according to claim 1, which comprises using a pressure process to perform the step of applying the insulation layer.

3. The method according to claim 2, which comprises using a laser to perform the step of forming the structural feature.

4. The method according to claim 1, which comprises using a laser to perform the step of forming the structural feature.

5. The method according to claim 1, which comprises:
    forming the structural feature as the roughened surface; and
    after forming the roughened surface and before applying metallization to a surface of the insulating layer, depositing nuclei on the surface of the insulating layer.

6. The method according to claim 5, which comprises providing palladium as the nuclei.

7. The method according to claim 1, which comprises using a pressure process to perform the step of configuring the flexible elevation on the first surface.

8. The method according to claim 7, which comprises:
    after performing the step of configuring the flexible elevation on the first surface, roughening the surface of the flexible elevation, at least in a region that is to be covered with the electrically conductive material.

9. The method according to claim 8, which comprises using a laser to perform the step of roughening the surface of the flexible elevation.

10. The method according to claim 8, which comprises:
    after performing the step of roughening the surface of the flexible elevation and before performing the step of covering the surface of the flexible elevation with the electrically conductive material, depositing nuclei on the surface of the flexible elevation.

11. The method according to claim 10, which comprises providing palladium as the nuclei.

12. The method according to claim 1, wherein the step of covering the surface of the flexible elevation with the electrically conductive material includes a step of applying the electrically conductive material to an outer surface that is outside of the recess of the flexible elevation.

13. The method according to claim 1, wherein the step of covering the surface of the flexible elevation with the electrically conductive material includes a step of applying the electrically conductive material to an inner surface within the recess of the flexible elevation.

14. An electronic module, comprising:
    a first electronic configuration with at least one perpendicular recess; and
    a second electronic configuration with at least one parallel recess;
    the first configuration being produced by the method according to claim 1;
    the second configuration being produced by the method according to claim 1; and
    the flexible elevation of the first electronic configuration engaging into the recess of the flexible elevation of the second configuration.

* * * * *